(12) United States Patent
Brindel et al.

(10) Patent No.: US 6,674,569 B2
(45) Date of Patent: Jan. 6, 2004

(54) OPTICAL POWER EQUALIZER

(75) Inventors: Patrick Brindel, Longpont-sur-Orge (FR); Stéphanie Barre, Villebon S/Yvette (FR); Denis Penninckx, Nozay (FR); Alexandre Shen, Paris (FR)

(73) Assignee: Alcatel, Paris (FR)

( * ) Notice: Subject to any disclaimer, the term of this patent is extended or adjusted under 35 U.S.C. 154(b) by 110 days.

(21) Appl. No.: 09/988,278

(22) Filed: Nov. 19, 2001

(65) Prior Publication Data

US 2002/0060838 A1 May 23, 2002

(30) Foreign Application Priority Data

Nov. 20, 2000 (EP) ................................ 0044301

(51) Int. Cl.[7] .............................................. H01S 3/00
(52) U.S. Cl. ....................................................... 359/344
(58) Field of Search ......................................... 359/344

(56) References Cited

U.S. PATENT DOCUMENTS

| | | | | |
|---|---|---|---|---|
| 5,434,701 | A | * 7/1995 | Fatehi et al. | 359/341.4 |
| 5,781,326 | A | 7/1998 | Chiaroni et al. | 359/237 |
| 6,118,117 | A | * 9/2000 | Ducellier et al. | 250/214 LA |
| 6,186,631 | B1 | * 2/2001 | Behringer et al. | 359/344 |
| 6,249,373 | B1 | * 6/2001 | Woodward | 359/344 |
| 6,366,382 | B1 | * 4/2002 | Morthier et al. | 359/179 |
| 6,462,865 | B1 | * 10/2002 | Chu et al. | 359/344 |
| 2002/0003652 | A1 | * 1/2002 | Leuthold | 359/332 |

FOREIGN PATENT DOCUMENTS

| | | | |
|---|---|---|---|
| EP | 0 853 397 A2 | 7/1998 | H04J/14/00 |
| EP | 0 862 286 A1 | 9/1998 | H04B/10/18 |
| JP | 11168258 A | * 6/1999 | H01S/3/18 |
| JP | 11168431 A | * 6/1999 | H04B/10/02 |

OTHER PUBLICATIONS

Bakonyi et al. 10Gbit/s RZ transmission over 5000km with gain–clamped semiconductor optical amplifiers and saturable absorbers. Electronics Letters. Oct. 12, 2000. vol. 36. No. 21. pp. 1790–1791.*
Agrawal, Govind P. Fiber–Optic Communication Systems. John Wiley & Sons, Inc. 2nd Edition. 1997. p. 503.*
Bakonyi Z et al: "In–line saturable absorber in transmission systems with cascaded semiconductor optical amplifiers" IEEE Photonics Technology Letters. May 2000, IEEE, USA, vol. 12, No. 5 pp. 570–572.

* cited by examiner

*Primary Examiner*—Thomas G. Black
*Assistant Examiner*—Deandra M. Hughes
(74) *Attorney, Agent, or Firm*—Sughrue Mion, PLLC

(57) ABSTRACT

Known optical power equalizers receive an optical main input signal modulating between high and low input power levels. The optical power equalizers emit an equalized optical main output signal modulating between high and low output power levels, where at least one of the two sets of high and low power levels is equalized to one high or one low output power level. Such devices can comprise at least one gain-clamped semiconductor optical amplifier that operates about its saturation range. The optical power equalizer receives an amplifier input signal, which has one or more modulated portions, and emits a modulated amplifier output signal. According to the invention the dependence of the gain-clamped semiconductor optical amplifier's gain on the power of the amplifier input signal is adjusted such that the high input power levels of the amplifier input signal are equalized into the one high output power level of the amplifier output signal.

14 Claims, 4 Drawing Sheets

OPTICAL POWER EQUALIZER

The invention refers to the field of optical power equalizers. Such devices are widely used in telecommunications via optical light guides.

BACKGROUND OF THE INVENTION

The invention is based on a priority application EP 00 440 301.0 which is hereby incorporated by reference.

In optical telecommunications signals, especially signals transmitting digital information, consist of an optical carrier wave of a certain wavelength travelling in an optical fiber and being modulated between—ideally—one high and one low power level. Unfortunately there are many phenomena like several stray mechanisms, absorption etc. contributing to a degradation of the signal's quality on its way from the transmitter terminal to the receiver terminal. Especially the high and the low levels of the modulated signal tend to vary around the one ideal high and the one ideal low power level respectively. Thus, it is necessary to regenerate the signal by means of regeneration modules, which are positioned at certain distances within the fiber line.

Opto-electronic devices are known, which perform an opto-electronic conversion of the optical signal into an electrical signal, e.g. by means of a fast photodiode. The electrical signal is amplified and electronic decision elements distinguish the high from the low power levels in order to create a new and regenerated electrical signal. The regenerated electrical signal is then fed into the control unit of a light source, e.g. a fast laser diode. The light source converts the electrical signal back into a fresh, regenerated optical signal. However, this way of regeneration involves several drawbacks. A rather complicated multi-component setup is needed involving elements like a photodiode, a broadband electrical amplifier and a broadband laser-driver or modulator driver. Such a setup is rather expensive and the large energy consumption is a further disadvantage. Additionally the speed of such systems is limited.

Another known means of signal regeneration works on an all-optical basis and uses the wavelength conversion properties of Mach-Zehnder interferometry. Such systems are even more complex than the opto-electronic ones described above, as they need expensive elements like CW-lasers and optical filters.

U.S. Pat. No. 5,781,326 discloses a two stage system, of which the second stage works on an interferometric basis, involving the disadvantages cited above. The first stage, however, which, for itself, represents an optical power equalizer according to the first portion of claim 1, is based on the use of a gain-clamped semiconductor optical amplifier (GC-SOA) according to the teaching of EP 0639 876 A1. A GC-SOA overcomes the drawback of high non-linearity of classical semiconductor amplifiers (SOA). To this end an internal laser oscillation is set up in the amplifier, which keeps constant the density of electronic charge carriers in the amplifier's active guide. The wavelength of the clamping oscillation is slightly different from the wavelength of the signal to be amplified. The power of the clamping oscillation is maximal, when no input signal is fed into the amplifier and it is reduced according to an increase of the input signal. The density of the electronic charge carriers, which depends on the total optical power in the active guide, is, thus, kept constant over a wide range of input power. As a consequence, the gain of an GC-SOA, which is, at first approximation, a linear function of this density, is constant, too. The linear behaviour comes to an end as soon as the input power becomes as high as the maximal power of the clamping oscillation. At this point the equilibrium between carrier injection by the pump current and recombination due to stimulated emission no longer holds and the carrier density and, consequently, the gain drops dramatically. This range is called the saturation range of the GC-SOA. The point, where the drop of gain starts, is called the saturation point.

The optical power equalizer according to the teaching of U.S. Pat. No. 5,781,326 uses a GC-SOA working about its saturation range, i.e the gain and/or the amplifier input signal are dimensioned such that the high input power levels are beyond the saturation point, while the low input power levels are below the saturation point in the linear range of the amplifier's gain. The amplifier input signal consists of two portions: a) a modulated portion of wavelength $\lambda_e$, which is identical to the main input signal, and b) a CW-laser portion of a slightly different wavelength $\lambda_b$. The total optical power of the amplifier input signal is dimensioned such, that the GC-SOA is still in the linear range, when the modulated part of the amplifier input signal is at a low power level and that it is beyond the saturation point, when the modulated part of the amplifier input signal is at a high power level. As a result the gain of the GC-SOA is at a fixed high level, when the modulated part of the amplifier input signal is at a low power level and it is at a low level depending on the actual input power, when the modulated part of the amplifier input signal is at a high power level. The non-modulated portion of the amplifier input signal is amplified by this modulated gain and selected from the amplifier output signal by means of a notch filter. Thus, the optical power equalizer emits a main output signal of wavelength $\lambda_b$, representing the inverse of the main input signal, where the set of high power levels is equalized to one high power level, while the set of low power levels still varies about the ideal one low power level.

The main disadvantage of this prior art is the essential need of an CW-laser which is expensive and energy consuming. Furthermore the conversion of wavelength, which is unfavorable in certain applications, is inevitable. Finally, the main output signal is necessarily the inverse of the main input signal. This might be useful in certain cases, but for the main part of applications, which need an un-inverted signal, this feature is undesirable.

SUMMARY OF THE INVENTION

It is an object of the invention to provide an optical power equalizer, in which the restricting disadvantages cited above do not occur at all or at least in a reduced way and not in the inevitable combination as in the prior art. As an effect, the desired device should be less complicated and more compact in its setup, more flexible in use and, hence, more cost efficient.

The concrete shape of the GC-SOA's gain as a function of the power of the amplifier input signal and especially its slope beyond the saturation point is largely accessible to design by people skilled in the art. According to the invention, the shape of the curve beyond the saturation point has to be adjusted such, that the high power levels of the amplifier input signal provoke a gain, which is suitable of amplifying this high input power level to one high output power level, which is the same for any of the occurring high input power levels. In other words, the dependence of the GC-SOA's gain on the power of the amplifier input signal has to be adjusted in such a way, that the high input power levels of the amplifier input signal are directly converted into the one high output power level of the amplifier output signal.

Consequently, the amplifier output signal is the true amplified and equalized version of the amplifier input signal and not, like in the prior art, a replacement signal of a different wavelength, the behaviour of which is somehow related to the amplifier input signal. Especially, no inversion of the signal occurs.

The invention is explained in further detail by the dependent claims, the further specification and the drawings.

Like in the prior art, the main output signal of this most simple version of the invention is equalized in only one of the two sets of high and low power levels. In order to achieve a completely equalized main output signal, i.e. a main output signal, in which the high as well as the low power levels of the main input signal are equalized to the one high and the one low output power level of the main output signal, a more elaborated device is necessary, joining more components to the basic device. Different variations of such devices are treated by further dependent claims, the further specification and further drawings.

BRIEF DESCRIPTION OF THE DRAWINGS

The drawings show

FIGS. 1a–1e: schematic drawings of the graphs of the GC-SOA's gain and the power of the amplifier input signal and the amplifier output signal to demonstrate the relationship between them.

FIG. 1a schematically shows the graph of an GC-SOA's gain $G(P)$ as a function of the optical input power P. The gain $G(P)$ is constant over a wide range of power P and drops dramatically at a certain point, the saturation point. FIG. 1b schematically shows an example input signal power $P_{in}(t)$. The signal is modulating between high and low levels of optical power. However, due to signal degradation along the fiber line before the equalizer, the high and the low power levels vary around one high and one low power level (an ideal, non degraded signal would alternate between the one high and the one low power level). The signal power $P_{in}(t)$ is fed into the GC-SOA, which is adjusted to work about its saturation range. Depending on the input power $P_{in}(t)$ as a function of time, the GC-SOA's gain $G(t)$ also varies as a function of time, as depicted in FIG. 1c. The input power $P_{in}(t)$ is not only used to control the gain $G(t)$, but also represents the signal to be amplified by the GC-SOA, i.e.—in mathematical terms—to be multiplied by the gain $G(t)$ (see FIG. 1d). If the dependence of the gain $G(P)$ on the input power P is correctly adjusted according to the invention, the low power levels of the input signal power $P_{in}(t)$ meet a constant amplification factor whereas the high power levels meet an adjusted amplification factor, which is the higher the lower the input power is, yielding only one high output power level of the amplifier output signal.

In the ideal case, the gain $G(P)$ behaves like $G(P)=G_0=$ const. for $P<=P_0$, where $P_0$ is the power at the saturation point, and like $G(P)=P_0 \, G_0/P$ otherwise. Obviously, in reality it is not possible to tune a GC-SOA to behave exactly in this idealized way. However, the gain $G(P)$ can be shaped to act this way to good approximation at least in certain parts of its "tail" beyond the saturation point. The concrete shape has to be chosen according to the concrete application.

As explained, this basic realization of the invention is only capable of partly equalizing the signal power. If a complete equalization of the high power levels as well as of the low power levels is desired, additional components are necessary. Different variants are explained in the following.

Figure 1:
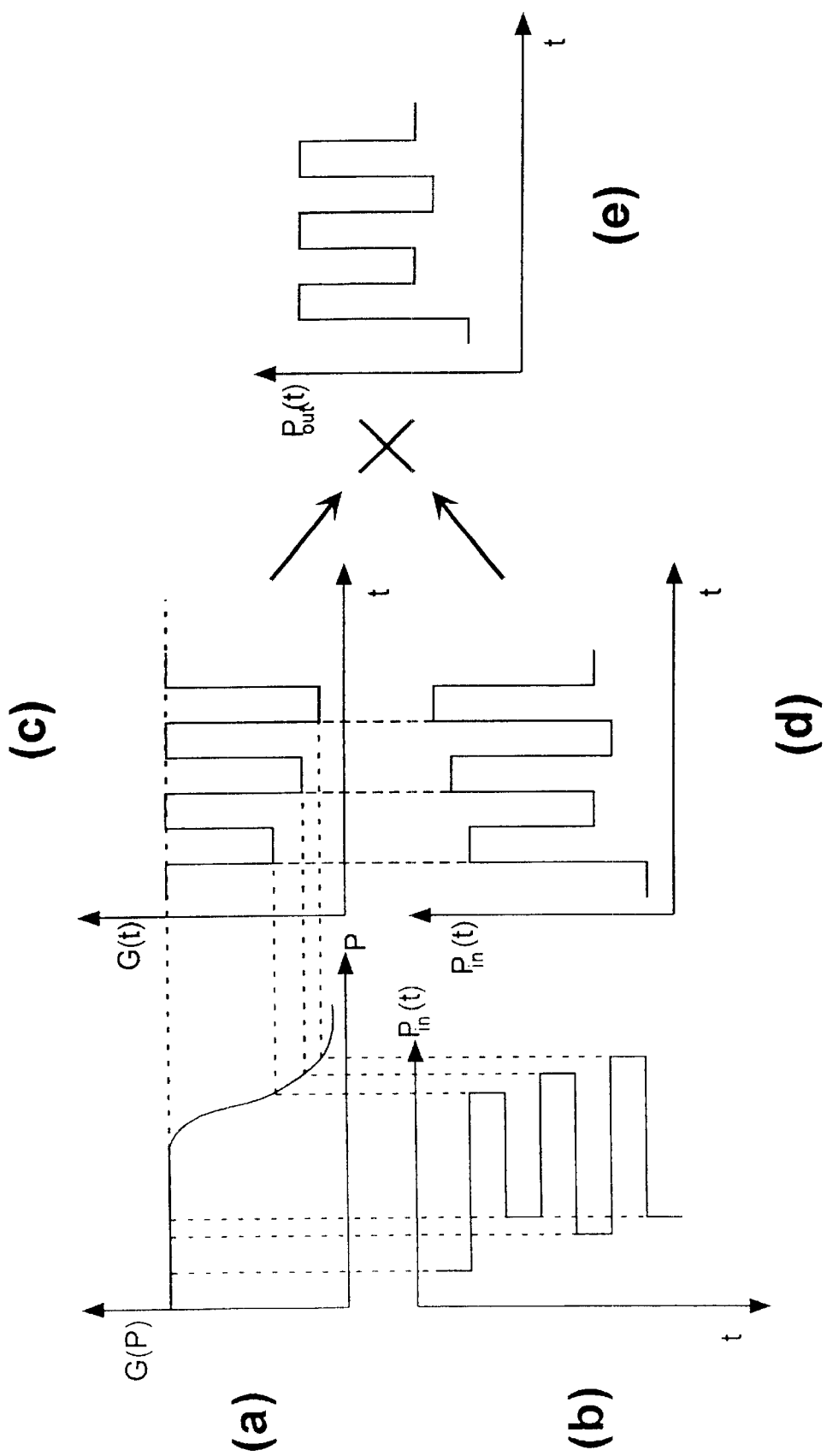
FIG. 1 shows the underlying principle of the optical power equalizer according to the invention.
Figure 2A:
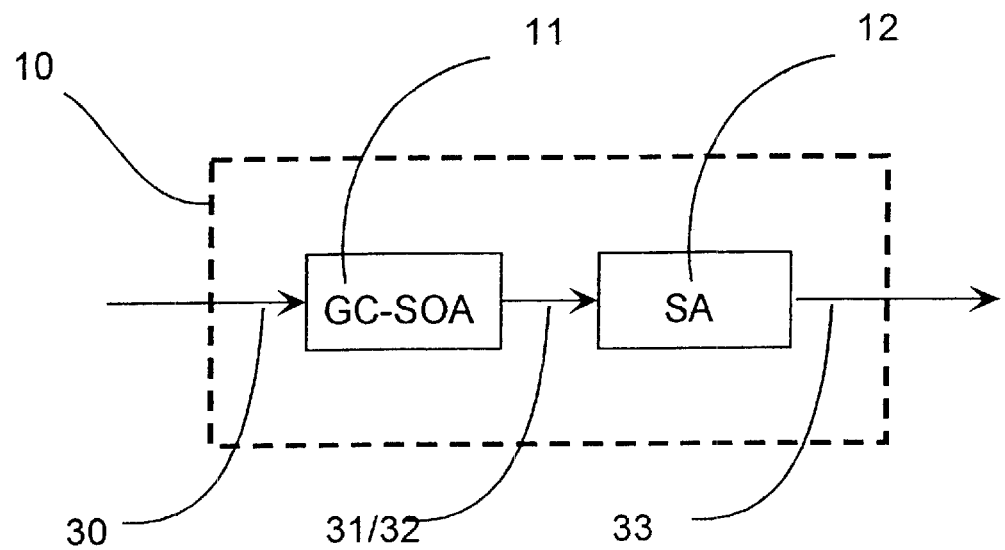
FIGS. 2a–2b: two schematic drawings of optical equalizer configurations using a saturatable absorber (SA) as a further component.
Figure 2B:
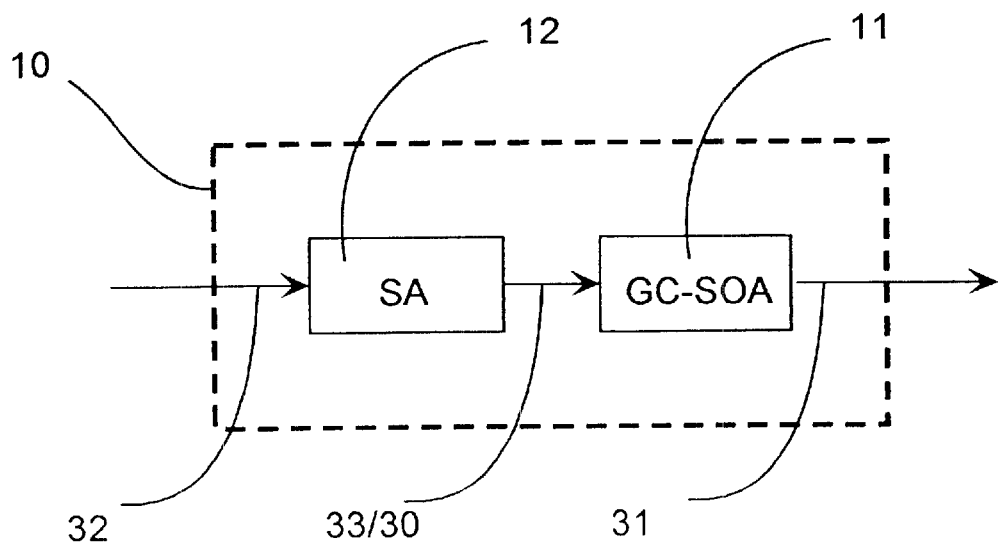

Most advantageously the further component is carried out as a saturable absorber (SA). FIG. 2 schematically shows two such configurations. In FIG. 2a the amplifier input signal 30 received by the GC-SOA is identical to the main input signal received by the optical power equalizer 10, as the GC-SOA is the first component of the equalizer. Its output signal 31 is identical to the SA input signal 32. The SA 12 absorbs low optical powers almost completely. On the other hand it becomes almost transparent, when high optical powers are fed to its input. The equalized high power levels of the amplifier output signal 31 are, hence, allowed to pass the SA 12 almost unaltered, whereas the low power levels of the amplifier output signal 31 are absorbed almost completely. Thus, the SA output signal 33, which is identical to the main output signal of the equalizer, is equalized in its high as well as in its low power levels. FIG. 2b shows a configuration, where the SA 12 precedes the GC-SOA 11. Here the main input signal is identical to the SA input signal 32, the amplifier input signal 30 is an intermediate signal, which is identical to the SA output signal 33 and the amplifier output signal is identical to the main output signal. It is obvious, that the result is just the same. It is also obvious, that the addition of further components like power amplifiers before, in between or behind a configuration as shown FIG. 2 does not affect the basic working mechanism of the device. Such power amplifiers could be fiber amplifiers like erbium doped fiber amplifiers (EDFA) or further semiconductor optical amplifiers (SOA), gain-clamped or not.

Figure 3:
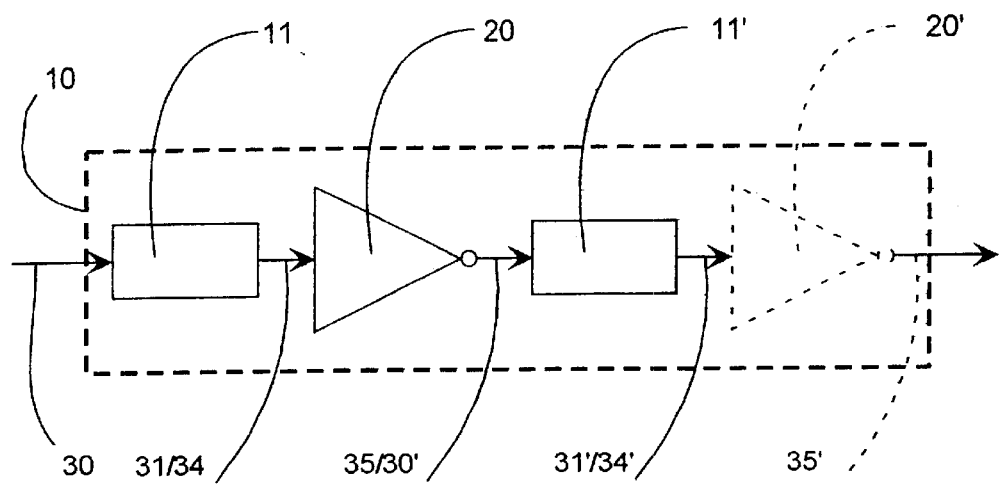
FIG. 3: a schematic drawing of a further configuration using a second GC-SOA and one or two data-to-complementary-data-inverters as further components.

FIG. 3 shows another configuration of an optical power equalizer 10 according to the invention. Additionally to the first GC-SOA 11, working on the first amplifier input signal 30 as explained above, a second GC-SOA 11', working in the same way as the first one, is provided. In between the GC-SOAs 11, 11' a data-to-complementary-data-inverter 20 is located. This component has got the task to invert the first amplifier output signal 31, which also is the first inverter input signal 34. As a result the inverter output signal 35 is a pre-equalized optical signal with equalized low power levels. This signal is fed to the second GC-SOA 11' as the second amplifier input signal 30'. Its not yet equalized high power levels are submitted to the equalizing function of the second GC-SOA 11'. This component emits the completely equalized second amplifier output signal 31' alternating between one high and one low power level. Obviously the second amplifier output signal 31' is inverted with respect to first amplifier input signal 30. In cases, where an inversion is undesirable, this signal can be fed to a second inverted 20' as a second inverter input signal 34'. The second inverters output signal 35', which is identical to the main output signal of the equalizer, has the same orientation as the main input signal, but shows a complete equalization of its high and low power levels.

Figure 4:
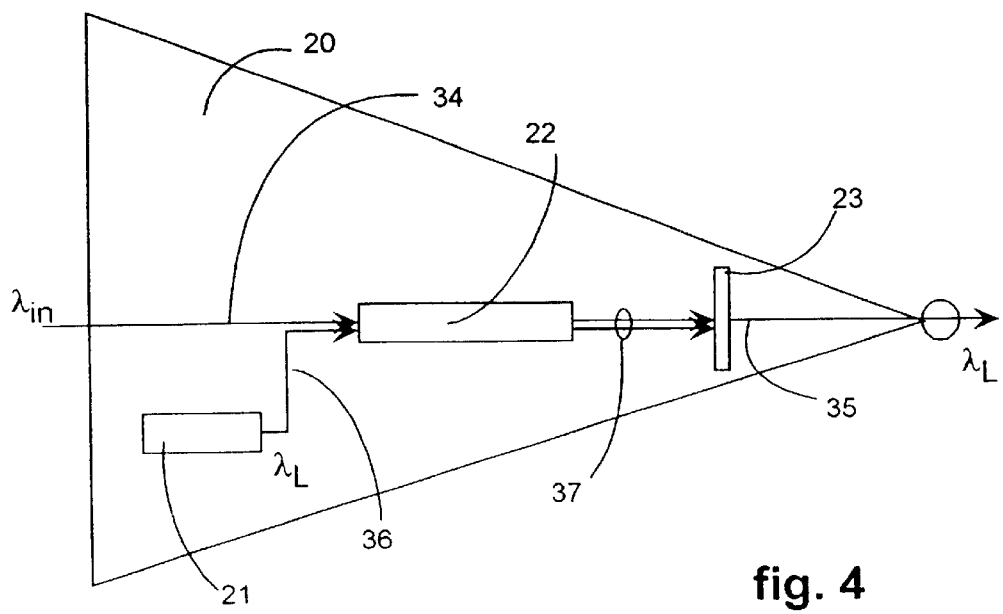
FIG. 4: an example of a data-to-complementary-data-inverter as used in the configuration of FIG. 3, and FIG. 5: optical equalization system for wavelength division multiplexing (WDM) application.

FIG. 4 shows, as an example, an advantageous configuration to carry out the inverter 20. The configuration works similarly to an equalizer according to the prior art, but with no equalization function. The inverter input signal 34 of wavelength $\lambda_{in}$ is fed to an SOA 22 working about its saturation range. Together with the signal 34 the light 36 of a CW-laser diode 21 of a different wavelength $\lambda_L$ is fed to the SOA 22. By means of the modulated portion 34 of the combined SOA input signal the gain of the SOA 22, working on both portions of the signal is modulated. As a result the SOA output signal 37 consists of two modulated portions of the wavelengths $\lambda_{in}$ and $\lambda_L$ respectively. By means of an optical notch filter 23 the two wavelengths are separated and the portion of wavelength $\lambda_L$ leaves the inverter as the inverter output signal 35. It is a disadvantage of the this configuration, that a CW-laser as well a wavelength conversion are involved. However, in comparison to a combination of modules according to the prior art still an advantage is achieved: depending on the concrete configuration either one CW-laser is saved or the desired orientation of the signal is achieved without a further inverting component.

Apart from the configuration shown in FIG. 4 the inverter 20 can also be carried out in an electro-absorption modulator- (EAM-) based or any other known manner.

Figure 5:
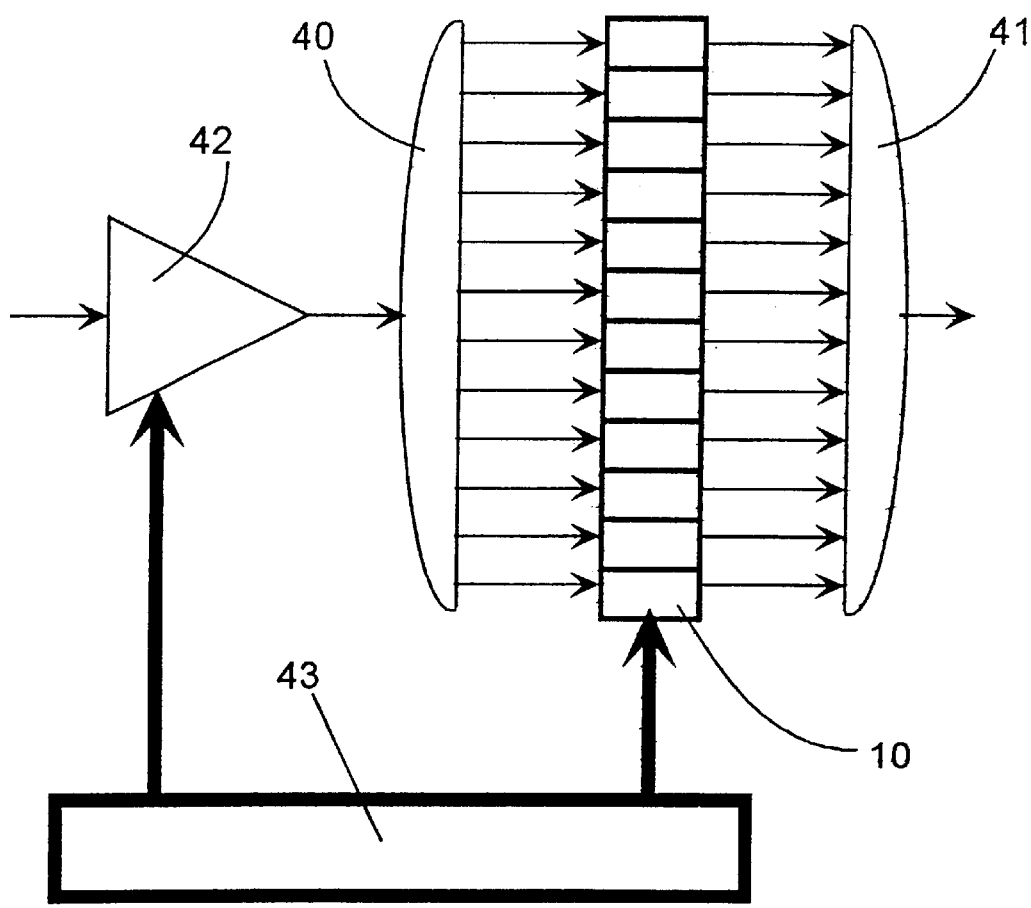

FIG. 5 schematically shows an optical power equalizer system for wavelength division multiplexing (WDM) applications. In WDM application several signals are transmitted simultaneously by the same fiber, each signal being a modulated optical carrier of a specific wavelength. Each signal has to be equalized individually. To this end the wavelengths are demultiplexed by means of a demultiplexer 40 comprising one input port and q output ports. In the example of FIG. 5 q=12. Each output port emits a signal of an individual wave length. The q signals are fed into a stack of q equalizers 10 according to the invention as explained above. The q equalized output signals are multiplexed back to an output fiber by means of a multiplexer 41. Such system is advantageously used in succession of a fiber amplifier 42, e.g. an EDFA in order to clean the signal from the noise introduced by the EDFA. If the EDFA and the stack of equalizers 10 are located closely enough together, the same power supply 43 can be used.

The optical power equalizer 10 according to the invention is very well suited to be fully- or hybrid-integrated. The same is true for its variants, as long as the further components are integratable. From a point of view of cost efficiency and easy handability an integration is most desirable.

It is obvious, that an equalizer according to the invention can be used in many configurations of which the ones shown here are only illustrating examples. In long haul transmission systems a number of equalizers has to be used, one succeeding the other in certain distances. They are preferably inserted in combination with preceding EDFAs. It can be seen from the explanations, that an equalizer according to the invention is a 2R regenerator, i.e. reamplification and reshaping are performed. If a 3R application including a retiming step is needed, it is possible to incorporate the 2R equalizer in a 3R regenerator scheme, e.g. using an optical clock recovery. Finally it is clear, that an equalizer according to the invention is independent of whether an RZ- or an NRZ- (return-to-zero- or not-return-to-zero-) format is used.

What is claimed is:

1. An optical power equalizer that receives an optical input signal that modulates between high and low input power levels, and outputs an equalized optical output signal modulating between high and low output power levels, where at least one of the high and low power levels is equalized to one high or one low output power level, the optical power equalizer comprising:

at least one gain-clamped semiconductor optical adjusted to work about its saturation range, which receives an amplifier input signal, comprising one or more portions of which at least one is modulated and the gain-clamped semiconductor optical amplifier emits a non-inverted modulated amplifier output signal, wherein the dependence of the gain-clamped semiconductor optical amplifier's gain on the power of the amplifier input signal is adjusted so the high input power levels of said amplifier input signal are equalized into one high output power level in the modulated amplifier output signal.

2. The optical power equalizer according to claim 1, further comprising a saturable absorber.

3. The optical power equalizer according to claim 1, wherein the saturable absorber is coupled to an output of the gain-clamped semiconductor optical amplifier, equalizing the modulated amplifier output signal.

4. The optical power equalizer according to claim 1, wherein the saturable absorber is coupled to an input of the gain-clamped semiconductor optical amplifier, pre-equalizing the amplifier input signal.

5. The optical power equalizer according to claim 1, further comprising a second gain-clamped semiconductor optical amplifier, and a data-to-complementary-data-inverter is positioned in between the two gain-clamped semiconductor optical amplifiers.

6. The optical power equalizer according to claim 1, wherein the inverter is an optical Electro-Absorption-Modulator-based inverter.

7. The optical power equalizer according to claim 1, wherein all components are combined in a fully-integrated module.

8. An optical power equalizer system comprising:

an input demultiplexer that demultiplexes an input signal comprising of q signal portions of different wavelengths into q individual signals of a single wavelength each, an output multiplexer that demultiplexes q individual signals of a single wavelength each into one output signal comprising of q signal portions of different wavelengths and an optical power equalizer according to claim 1.

9. Optical power equalizer system according to claim 8, wherein all components are combined in a fully-integrated module.

10. Optical telecommunication fiber line comprising signal regenerator stations at certain distances along the fiber line, wherein at least one regenerator station comprises an optical power equalizer according to claim 1.

11. The optical power equalizer according to claim 1, wherein the inverter is a Semiconductor-Optical-Amplifier-based inverter.

12. The optical power equalizer according to claim 1, wherein all components are combined in a hybrid-integrated module.

13. The optical power equalizer according to claim 8, wherein all components are combined in a hybrid-integrated module.

14. Optical telecommunication fiber line comprising signal regenerator stations at certain distances along the fiber line, wherein at least one regenerator station comprises an optical power equalizer system according to claim 10.

* * * * *